(12) United States Patent
Senoo

(10) Patent No.: US 8,196,023 B2
(45) Date of Patent: Jun. 5, 2012

(54) ENCODER AND OPTICAL DISK RECORDING APPARATUS

(75) Inventor: Daigo Senoo, Osaka (JP)

(73) Assignee: Panasonic Corporation, Osaka (JP)

( * ) Notice: Subject to any disclaimer, the term of this patent is extended or adjusted under 35 U.S.C. 154(b) by 272 days.

(21) Appl. No.: 12/718,490

(22) Filed: Mar. 5, 2010

(65) Prior Publication Data

US 2010/0235719 A1    Sep. 16, 2010

(30) Foreign Application Priority Data

Mar. 10, 2009    (JP) ................................. 2009-056983

(51) Int. Cl.
    *H03M 13/00* (2006.01)
(52) U.S. Cl. ...................................... 714/780; 714/805
(58) Field of Classification Search .................. 714/784, 714/763, 785, 769, 780, 805; 369/59.25
    See application file for complete search history.

(56) References Cited

U.S. PATENT DOCUMENTS

| | | | | |
|---|---|---|---|---|
| 6,112,324 | A * | 8/2000 | Howe et al. | ................... 714/763 |
| 6,505,268 | B1 * | 1/2003 | Schultz et al. | ................... 711/4 |
| 7,975,208 | B2 * | 7/2011 | Chao et al. | ................... 714/769 |
| 8,059,512 | B2 * | 11/2011 | Sasaki | ................... 369/59.25 |
| 2004/0165504 | A1 | 8/2004 | Kobayashi | |
| 2008/0267032 | A1 | 10/2008 | Kobayashi | |

FOREIGN PATENT DOCUMENTS

| | | |
|---|---|---|
| JP | 2001-156649 | 6/2001 |
| JP | 2006-33233 | 2/2006 |
| JP | 2008-123648 | 5/2008 |
| WO | WO 2005/089075 A2 | 9/2005 |

* cited by examiner

*Primary Examiner* — David Ton

(74) *Attorney, Agent, or Firm* — McDermott Will & Emery LLP

(57) ABSTRACT

An encoder includes an information holding section which stores flag bytes and an initial address, a data generation section which generates sets of first parity symbols from the initial address and the flag bytes, a parity generation section which generates and outputs sets of second parity symbols, for each column of data units included in the block, from the columns of data units included in the block and input user control data. The data generation section generates the addresses and the sets of first parity symbols, required to generate the columns of data units included in the block, based on the initial address and the flag bytes, selects necessary portions from the flag bytes and the addresses and the sets of first parity symbols generated, and outputs the portions to the parity generation section, as the columns of data units included in the block.

19 Claims, 10 Drawing Sheets

FIG.8

| Term | Remainder |
|---|---|
| $x^3$ | 0xa7·AUN(0,S) + 0x54·AUN(1,S) + 0x5c·AUN(2,S) + 0x63·AUN(3,S) + 0x0f·AUN(4,S) |
| $x^2$ | 0xd9·AUN(0,S) + 0x8c·AUN(1,S) + 0x07·AUN(2,S) + 0x57·AUN(3,S) + 0x36·AUN(4,S) |
| $x^1$ | 0xdb·AUN(0,S) + 0x47·AUN(1,S) + 0xbf·AUN(2,S) + 0xd2·AUN(3,S) + 0x78·AUN(4,S) |
| $x^0$ | 0xa4·AUN(0,S) + 0x9e·AUN(1,S) + 0xe5·AUN(2,S) + 0xe7·AUN(3,S) + 0x40·AUN(4,S) |

ENCODER AND OPTICAL DISK RECORDING APPARATUS

CROSS-REFERENCE TO RELATED APPLICATION

The disclosure of Japanese Patent Application No. 2009-056983 filed on Mar. 10, 2009 in Japan, including the specification, the drawings, and the claims therein, is hereby incorporated by reference in its entirety into this application.

BACKGROUND

The technology disclosed in the specification relates to encoders and optical disk recording devices used for recording data onto optical disks, etc.

In recent years, HD (high definition) video broadcasting services and large-screen televisions have been dramatically increasing. With improvement in quality and resolution of video images, optical disks, as recording media for video images, have larger storage capacities. As large-capacity disks, Blu-ray Discs (hereinafter referred to as "BDs") are known. In order to ensure an error correction capability for data recorded in high density, Long Distance Code (hereinafter referred to as "LDC"), which is obtained from user data, and Burst Indicator Subcode (hereinafter referred to as "BIS"), which is obtained from user control data, addresses, and flags, are defined in the BD format specification.

From addresses and flags, AUN (address unit number) parity symbols are generated, and these addresses, flags, and AUN parity symbols are interleaved. From data after this interleaving operation, BIS parity symbols are generated. The BIS parity symbols are recorded onto an optical disk together with the LDC. Related technologies are described in International Publication WO 2005/089075.

However, since BIS parity symbols are generated from interleaved data, one block of AUN parity symbols are all required to be generated in advance. For example, addresses, etc., stored in a storage device are read and AUN parity symbols are generated; the AUN parity symbols are written into the storage device; the AUN parity symbols are read from the storage device and interleaving is performed; and the result is again written into the storage device. Then, the interleaved AUN parity symbols, etc., are read and BIS parity symbols are generated, and then the BIS parity symbols are written into the storage device.

With such a process of BIS parity generation, since interleaving can only be performed after AUN parity generation, and since BIS parity symbols can only be generated after this interleaving, generation of BIS parity symbols requires a relatively long time to be performed. Moreover, since a large number of accesses are performed to the storage device, a large portion of the transmission bandwidth of the storage device is occupied. Furthermore, since AUN parity symbols, etc., generated during the process need to be stored, a storage device needs to have a large capacity.

SUMMARY

A device in accordance with an embodiment of the present invention may allow for acceleration of parity generation.

An encoder in accordance with an embodiment of the present invention, which generates a block including a plurality of addresses, a plurality of flag bytes respectively corresponding to the plurality of addresses, and a plurality of sets of first parity symbols respectively corresponding to the plurality of addresses, where the plurality of addresses, the plurality of flag bytes, and the plurality of sets of first parity symbols are interleaved according to a predetermined rule, and which generates a plurality of sets of second parity symbols respectively corresponding to each column of data units included in the block, includes an information holding section configured to store the plurality of flag bytes and an initial address, a data generation section configured to generate the plurality of sets of first parity symbols from the initial address and from the plurality of flag bytes, and a parity generation section configured to generate and output the plurality of sets of second parity symbols, for each column of data units included in the block, from the columns of data units included in the block and from input user control data. The data generation section generates the addresses and the sets of first parity symbols, required to generate the columns of data units included in the block, based on the initial address and the plurality of flag bytes; selects necessary portions from the plurality of flag bytes and the addresses and the sets of first parity symbols generated; and outputs the portions to the parity generation section, as the columns of data units included in the block.

Accordingly, the data generation section generates the addresses and the sets of first parity symbols, required to generate the columns of data units included in the block after being interleaved, based on the initial address and the plurality of flag bytes. As such, the sets of second parity symbols corresponding to the columns of data units included in the block after being interleaved can be generated without the need to generate all the data included in the block before being interleaved. Therefore, the generation process of the sets of second parity symbols can be accelerated.

An optical disk recording apparatus in accordance with an embodiment of the present invention, which records user control data and user data onto an optical disk, includes an encoder configured to generate a block including a plurality of addresses, a plurality of flag bytes respectively corresponding to the plurality of addresses, and a plurality of sets of first parity symbols respectively corresponding to the plurality of addresses, where the plurality of addresses, the plurality of flag bytes, and the plurality of sets of first parity symbols are interleaved according to a predetermined rule, and to generate a plurality of sets of second parity symbols respectively corresponding to each column of data units included in the block, an interleaver configured to interleave the block, the plurality of sets of second parity symbols, the user control data, the user data, and LDC parity symbols calculated based on the user data, a modulator configured to generate a modulated signal depending on the interleaved data, and an optical pickup configured to record the modulated signal onto the optical disk. The encoder includes an information holding section configured to store the plurality of flag bytes and an initial address, a data generation section configured to generate the plurality of sets of first parity symbols from the initial address and from the plurality of flag bytes, and a parity generation section configured to generate and output the plurality of sets of second parity symbols, for each column of data units included in the block, from the columns of data units included in the block and from the user control data. The data generation section generates the addresses and the sets of first parity symbols, required to generate the columns of data units included in the block, based on the initial address and the plurality of flag bytes; selects necessary portions from the plurality of flag bytes and the addresses and the sets of first parity symbols generated; and outputs the portions to the parity generation section, as the columns of data units included in the block.

According to an embodiment of the present invention, since there is no need to generate all the data included in the block before being interleaved, the generation process of the parity symbols can be accelerated. Decrease of the number of accesses to a storage device allows for reduction of the transmission bandwidth and/or capacity needed for a storage device.

BRIEF DESCRIPTION OF THE DRAWINGS

FIG. 8 is a diagram illustrating AUN parity symbols.

DETAILED DESCRIPTION

An example embodiment of the present invention will be described below with reference to the drawings, in which like reference symbols indicate the same or similar components.

Each functional block in this specification may be typically implemented by hardware. For example, each functional block may be formed on a semiconductor substrate as a part of an IC (integrated circuit). Here, the term "IC" includes LSIs (large-scale integrated circuits), ASICs (application-specific integrated circuits), gate arrays, FPGAs (field programmable gate arrays), etc. As an alternative way, a part or all of each functional block may be implemented by software. For example, such a functional block may be implemented by a program executed on a processor. In other words, each functional block described in this specification may be implemented by hardware, software, or any combination thereof.

Figure 1:
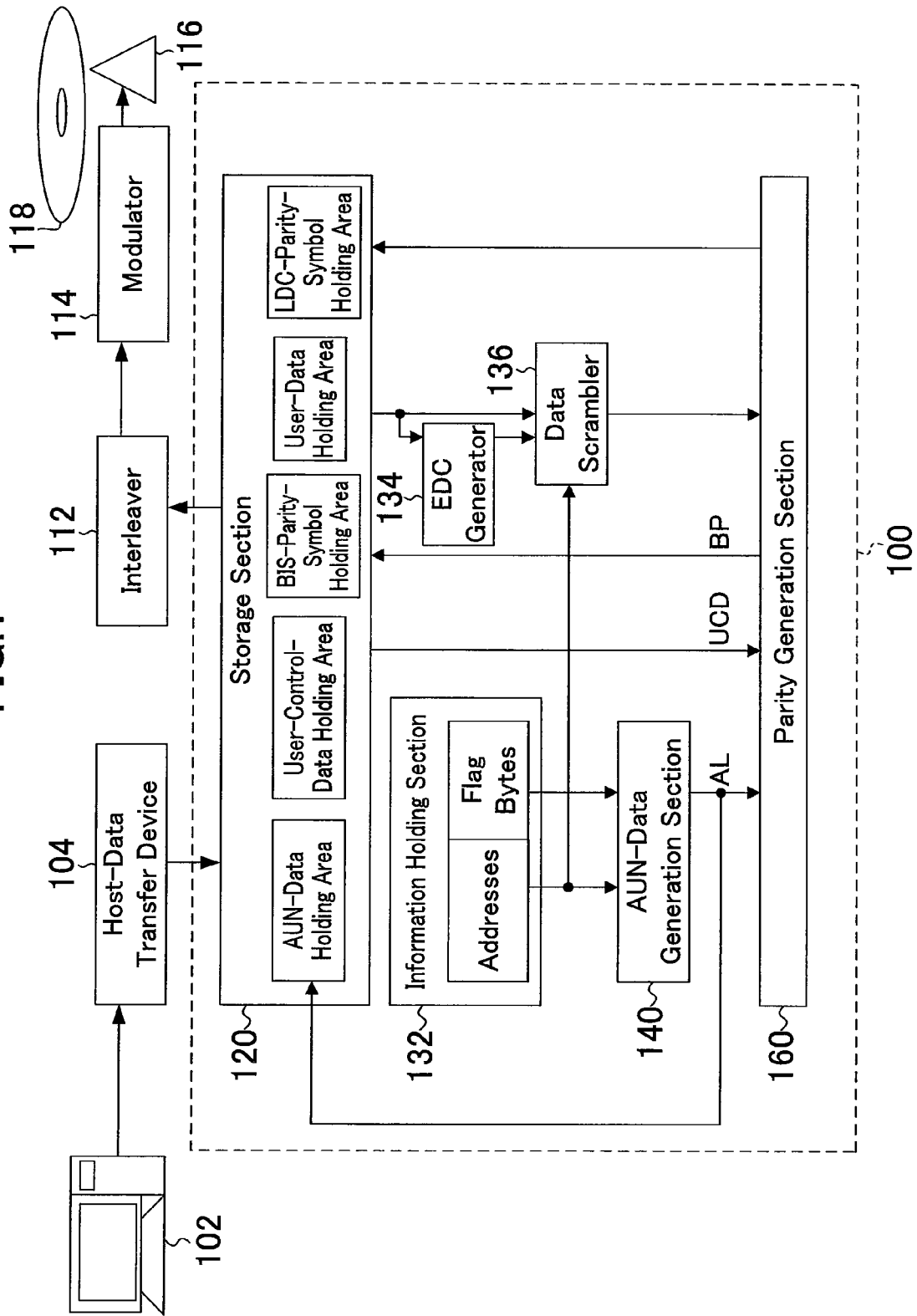
FIG. 1 is a block diagram illustrating an example configuration of an optical disk recording device in accordance with an embodiment of the present invention.

FIG. 1 is a block diagram illustrating an example configuration of an optical disk recording device in accordance with an embodiment of the present invention. The optical disk recording device of FIG. 1 includes an encoder 100, a host-data transfer device 104, an interleaver 112, a modulator 114, and an optical pickup 116. The encoder 100 includes a storage section 120, an information holding section 132, an error-detection-code generator (EDC generator) 134, a data scrambler 136, an AUN-data generation section 140, and a parity generation section 160.

The host-data transfer device 104 receives user control data and user data which are output from a host device 102 (e.g., a personal computer) via an interface in conformance with a standard such as ATAPI (AT attachment packet interface) or SATA (serial advanced technology attachment), and transfers the received data to the storage section 120. The user control data includes copyright information, etc. The storage section 120 is, for example, an SDRAM (synchronous dynamic random-access memory), and includes an AUN-data holding area, a user-control-data holding area, a BIS-parity-symbol holding area, a user-data holding area, and an LDC-parity-symbol holding area. The storage section 120 stores the user control data in the user-control-data holding area, and the user data in the user-data holding area. The encoder 100 generates AUN data (address information), and also generates BIS parity symbols based on the user control data, and LDC parity symbols based on the user data, all of which are output to the storage section 120.

The interleaver 112 reads from the storage section 120 the BIS data (i.e., the AUN data and the user control data), the BIS parity symbols, the user data, and the LDC parity symbols, converts them to a data stream for a BD by interleaving, and then outputs the data stream to the modulator 114. The modulator 114 generates a modulated signal depending on the data stream received from the interleaver 112, and outputs the modulated signal to the optical pickup 116. The optical pickup 116 emits light, which corresponds to the modulated signal, to a BD 118, thereby records the modulated signal on the BD 118 as an optical disk.

Figure 2:
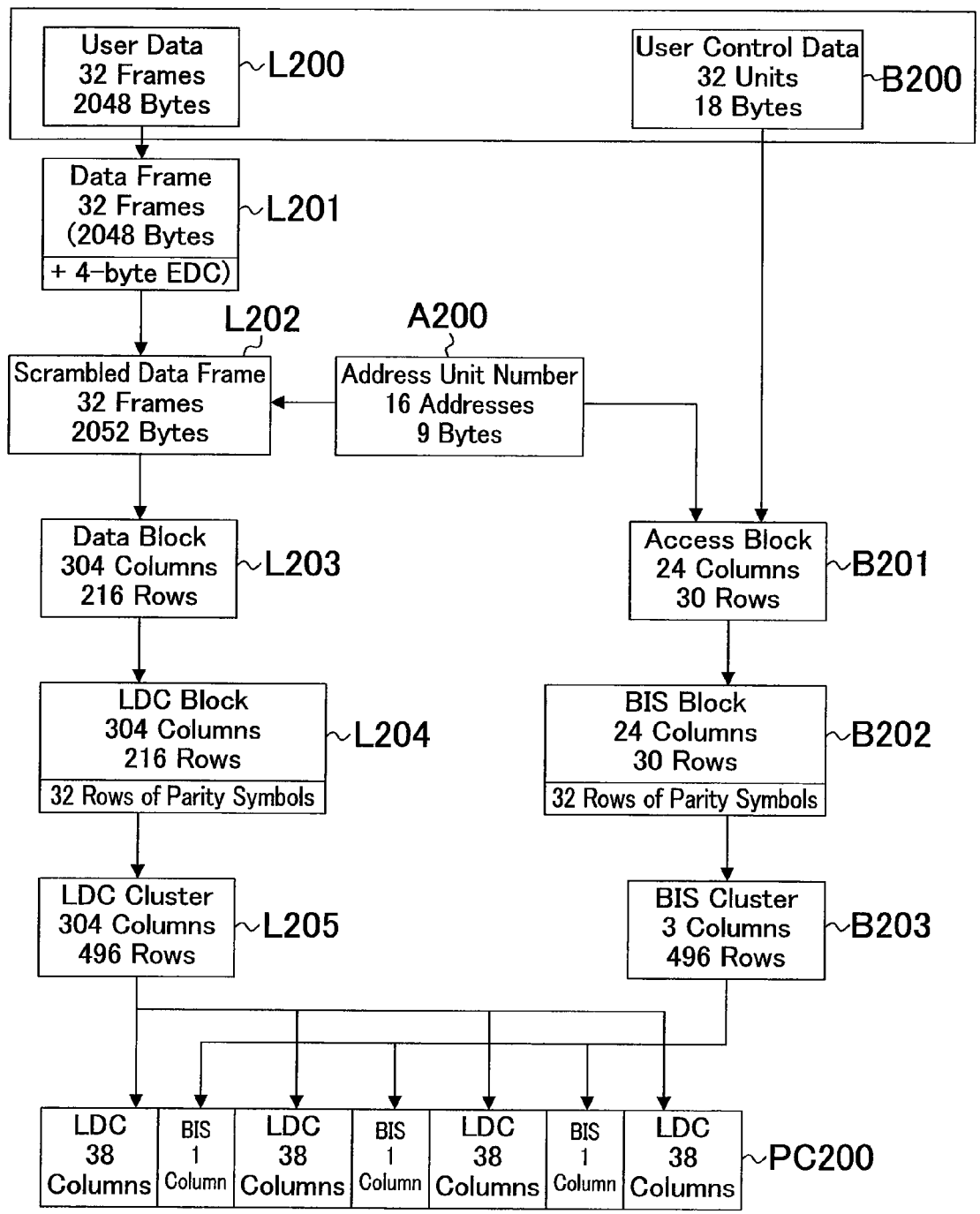
FIG. 2 is a conceptual diagram illustrating the flow of process until data to be recorded on a BD is generated.
Figure 3:
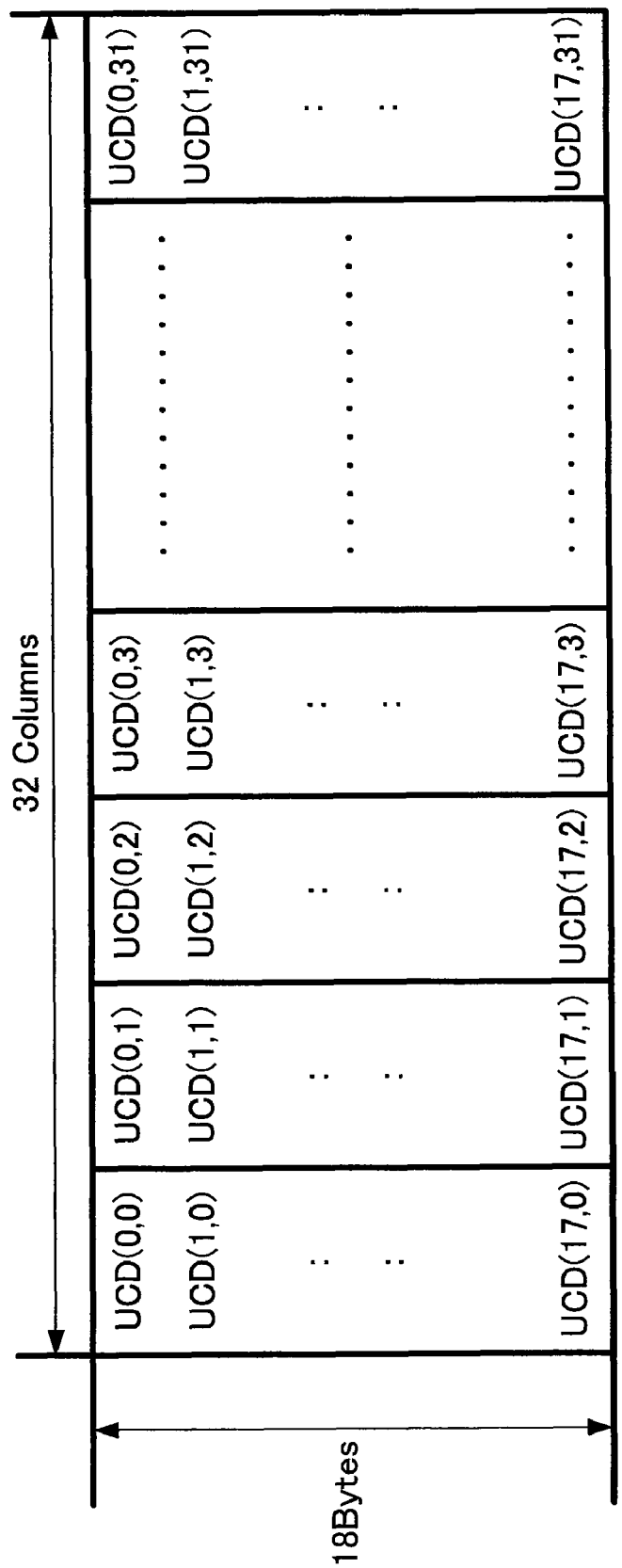
FIG. 3 is a diagram illustrating the user control data of FIG. 2.

FIG. 2 is a conceptual diagram illustrating the flow of process until data to be recorded on a BD is generated. FIG. 3 is a diagrammatic illustration of the user control data B200 of FIG. 2. A flow of process with respect to the user control data B200 will be described first. An address unit number symbol AUN(x, y), a user control data symbol UCD(x, y), and a BIS parity symbol BP(x,y) are each one data unit, and are each assumed to be one-byte data.

The user control data B200 is input from the host-data transfer device 104, and stored in the user-control-data holding area of the storage section 120. As shown in FIG. 3, user control data UCD(0, 0), UCD(1, 0), . . . , and UCD(17, 0) constitute a unit of 18 bytes, and 32 units of similar configuration form one block.

Figure 4:
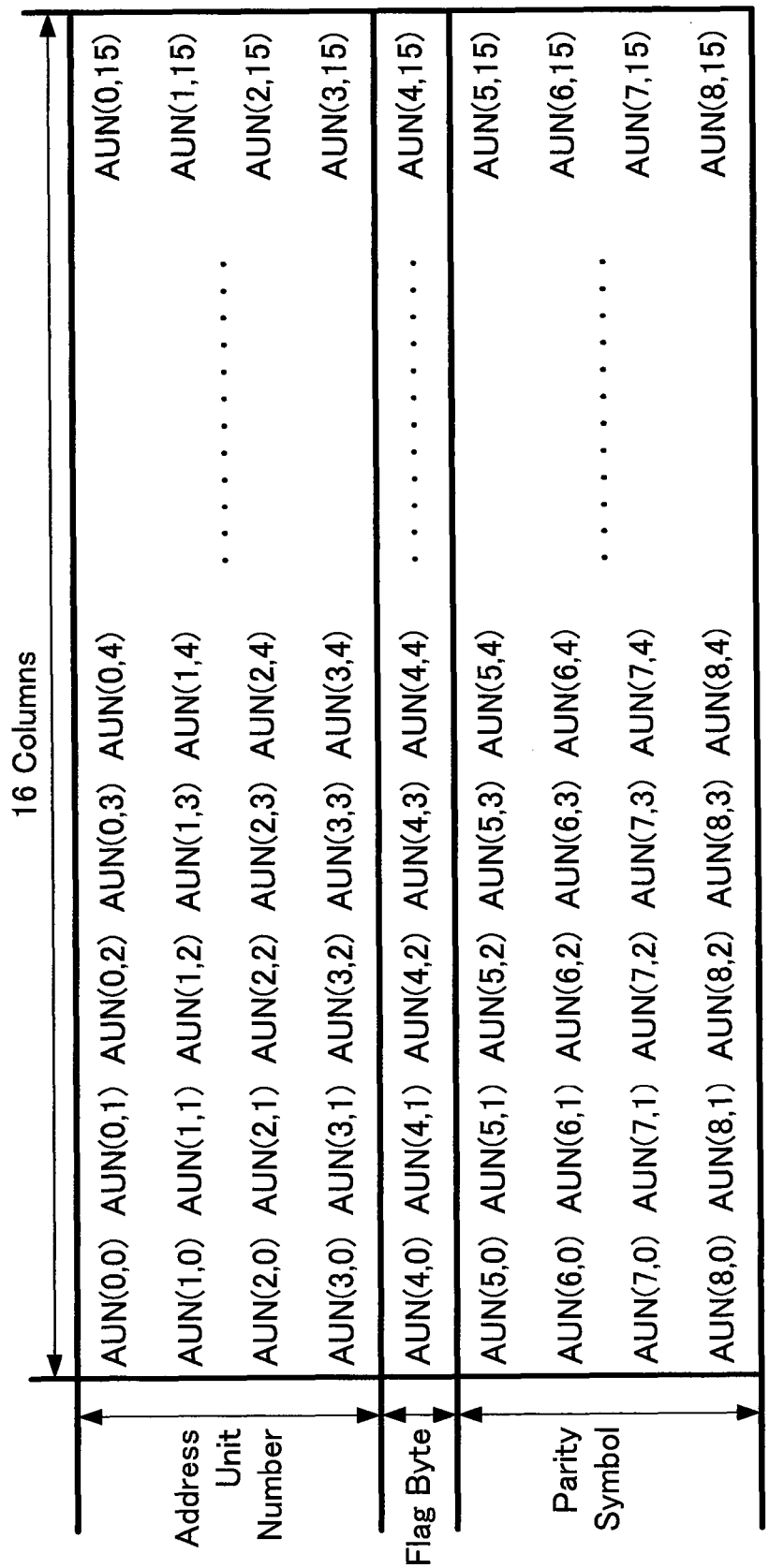
FIG. 4 is a diagram illustrating the address unit numbers of FIG. 2.

FIG. 4 is a diagrammatic illustration of the address unit numbers (AUNs) A200 of FIG. 2. A four-byte address (AUN (0, 0) to AUN(3, 0)), a flag byte (AUN(4, 0)), and four bytes of AUN parity symbols (AUN(5, 0) to AUN(8,0)) as a first set of parity symbols constitute a unit of nine bytes, and 16 units of similar configuration form one block. The flag byte includes control information. The AUN parity symbols are used for error correction.

The AUN parity symbols are Reed-Solomon codes (9, 5, 5) calculated from five bytes of data, that is, a four-byte address (such as AUN(0, 0) to AUN(3, 0)) and a flag byte (such as AUN(4, 0)). As the primitive polynomial for a Galois field GF $(2^8)$, an equation:

$$p(x)=x^8+x^4+x^3+x^2+1 \quad \text{(Eq. 1)}$$

is used. The generator polynomial for the AUN parity symbols is expressed as follows:

$$g(x) = \prod_{i=0}^{3} (x - \alpha^i) \quad \text{(Eq. 2)}$$

The AUN parity symbols are defined in a generalized way as follows:

$$\sum_{i=5}^{8} AUN(x, S)x^{(8-i)} = \sum_{i=0}^{5} AUN(x, S)x^{(8-i)} \bmod g(x) \quad \text{(Eq. 3)}$$

Figure 5:
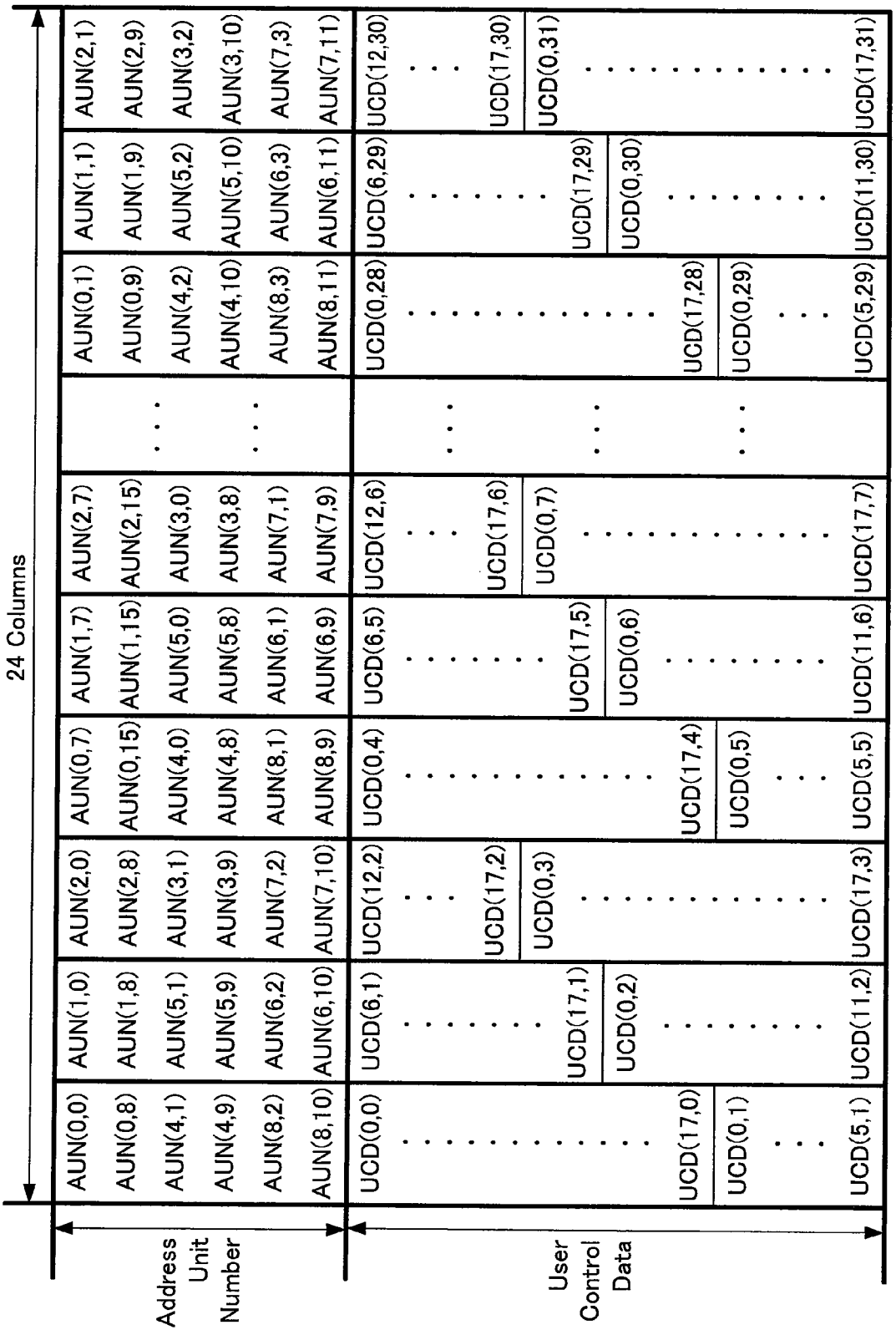
FIG. 5 is a diagram illustrating the access block of FIG. 2.

FIG. 5 is a diagrammatic illustration of the access block B201 of FIG. 2. In order to generate BIS parity symbols, the user control data B200 and the address unit numbers A200 need to be interleaved. In FIG. 5, interleaved user control data B200 and address unit numbers A200 are shown.

The address unit number symbol AUN(x, y) in the block of FIG. 4 is allocated in the $r^{th}$ row and the $c^{th}$ column in FIG. 5 (where r and c are integers satisfying $0 \leq r \leq 5$ and $0 \leq c \leq 23$, respectively) by being interleaved according to a rule which is expressed, for example, by the following equation:

$$r=2 \times \text{div}(x,3)+\text{div}(y,8) \quad \text{(Eq. 4)}$$

$$c=3 \times \text{mod}((\text{div}(x,3)+16-y),8)+\text{mod}((x-\text{div}(x,3)),3) \quad \text{(Eq. 5)}$$

This rule complies with the BD specification. Here, the uppermost row is considered as the zeroth row, and the leftmost column is considered as the zeroth column. In each column of FIG. 5, below the six bytes of address unit number, 24 bytes of user control data are allocated.

Figure 6:
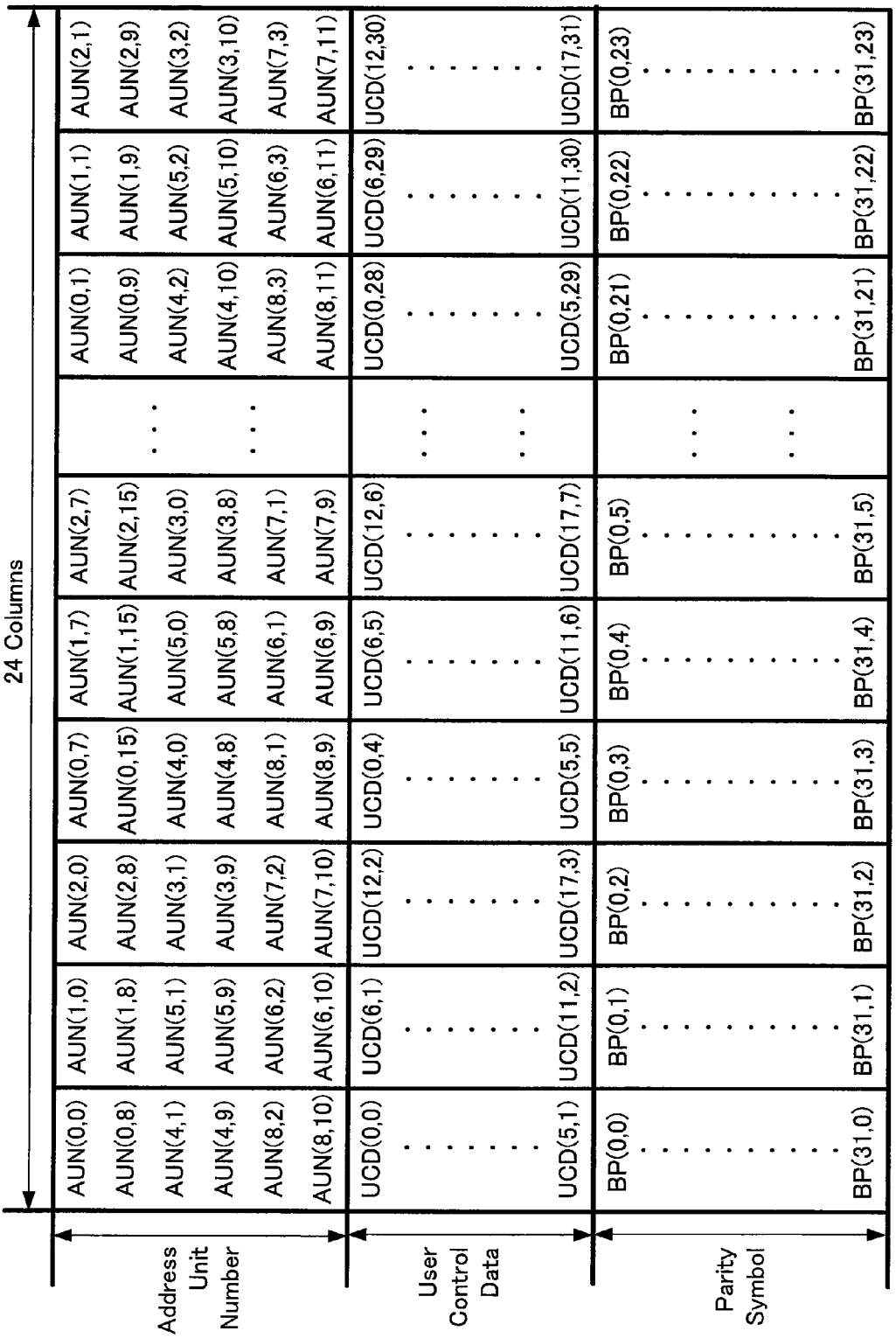
FIG. 6 is a diagram illustrating the BIS block of FIG. 2.

FIG. 6 is a diagrammatic illustration of the BIS block B202 of FIG. 2. In each column of FIG. 6, 32 bytes of BIS parity symbols as a second set of parity symbols (e.g., in the leftmost column, BP(0, 0), BP(1, 0), ..., and BP(31, 0)) are obtained from the six bytes of address unit number and the 24 bytes of user control data, and are added to the address unit number and the user control data. The generator polynomial for BIS parity symbols is:

$$G(x) = \prod_{i=0}^{31} (x - \alpha^i) \quad \text{(Eq. 6)}$$

Sorting the BIS block B202 results in a BIS cluster B203.

Next, a flow of process with respect to the user data L200 will be briefly described. A data frame L201 is generated by adding an error detection code (EDC) to each frame of the user data L200. A scrambled data frame L202 is generated based on the data frame L201 and the address unit numbers A200. Then, from the scrambled data frame L202, a data block L203, an LDC block L204, and an LDC cluster L205 are generated sequentially. The LDC block L204 includes LDC parity symbols obtained based on the data block L203. Thereafter, the interleaver 112 interleaves the LDC cluster L205 and the BIS cluster B203, and generates a code PC200. This code PC200 is recorded on the BD 118.

The encoder 100 will be described below in detail. In each column of a block configured with address unit numbers such as shown in FIG. 4, AUNs from the first row to the fourth row (AUN(0, S) to AUN(3, S)) (where S is an integer satisfying $0 \leq S \leq 15$) represent an address. The information holding section 132 stores the top address in the block of FIG. 4 (i.e., the address represented by AUN(0, 0), AUN(1, 0), AUN(2, 0), and AUN(3, 0)) as the initial address, and stores the flag bytes AUN(4, 0), AUN(4, 1), ..., and AUN(4, 15), each of which corresponds to each address. The block of FIG. 4 is the unit for interleaving. Note that in cases where the flag bytes AUN(4, 0), AUN(4, 1), ..., and AUN(4, 15) do not change, the information holding section 132 does not need to hold these flag bytes since a constant number may be used as these values.

Figure 7:
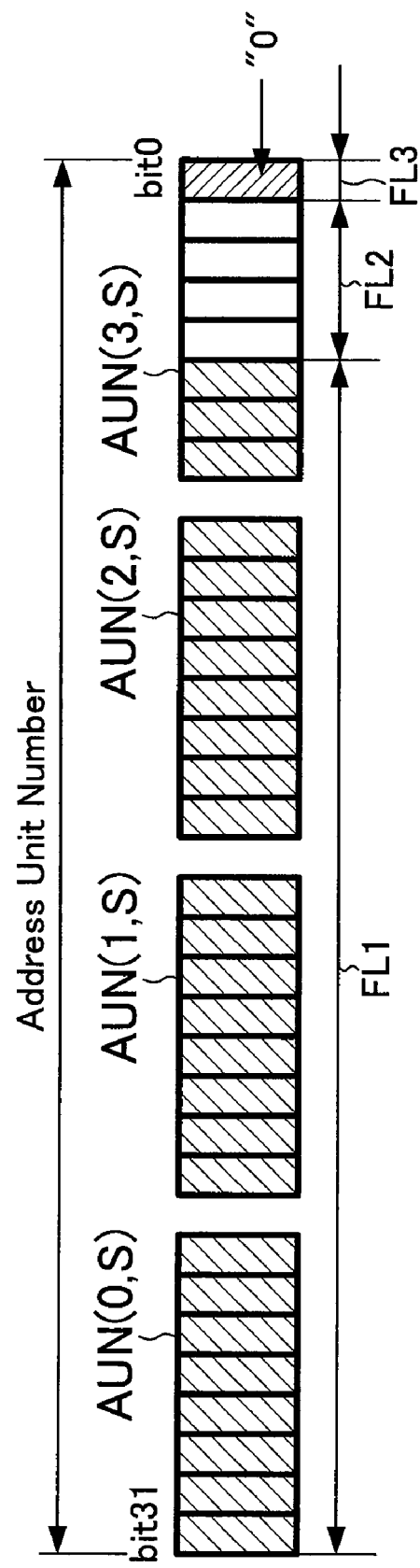
FIG. 7 is a diagram illustrating the fields of an address unit number of FIG. 4.

FIG. 7 is a diagrammatic illustration showing the fields of an address unit number of FIG. 4. A field FL1 is the most significant 27 bits of the address, represented by AUN(0, S), AUN(1, S), AUN(2, S), and AUN(3, S); and the field FL1 is constant within one block. A field FL2, which is a next lower field to the field FL1, is incremented by one for each column of FIG. 4. The least significant field FL3 is fixed to a value of "0." That is, incrementation of the value of the field FL2 by one for each column using the top address as a base value can generate 16 addresses of FIG. 4. Thus, the information holding section 132 does not need to store all the data from the first to fourth rows, but as for the addresses, storing only the top address AUN(0, 0) to AUN(3, 0) shown in the leftmost column is sufficient.

When the value of the field FL2 of the top address is constant, the information holding section 132 may store only the value of the field FL1 of the top address. The information holding section 132 may store one of the 16 addresses in the block of FIG. 4 as the initial address for later use, instead of the top address.

Expanding the generator polynomial (Eq. 2), the following equation is obtained:

$$g(x)=x^4+0x0F \cdot x^3+0x36 \cdot x^2+0x78 \cdot x^1+0x40 \cdot x^0 \quad \text{(Eq. 7)}$$

The coefficient of each term of this equation is an eight-bit hexadecimal number, and also an element of a Galois field GF($2^8$). All operations need to be performed according to rules for a Galois field.

FIG. 8 is a diagrammatic illustration of AUN parity symbols. Using Eq. 7, each term of the right side of Eq. 3 can be represented as shown in FIG. 8. That is, AUN parity symbols can be obtained using AUN(0, S), AUN(1, S), AUN(2, S), AUN(3, S), and AUN(4, S).

Figure 9:
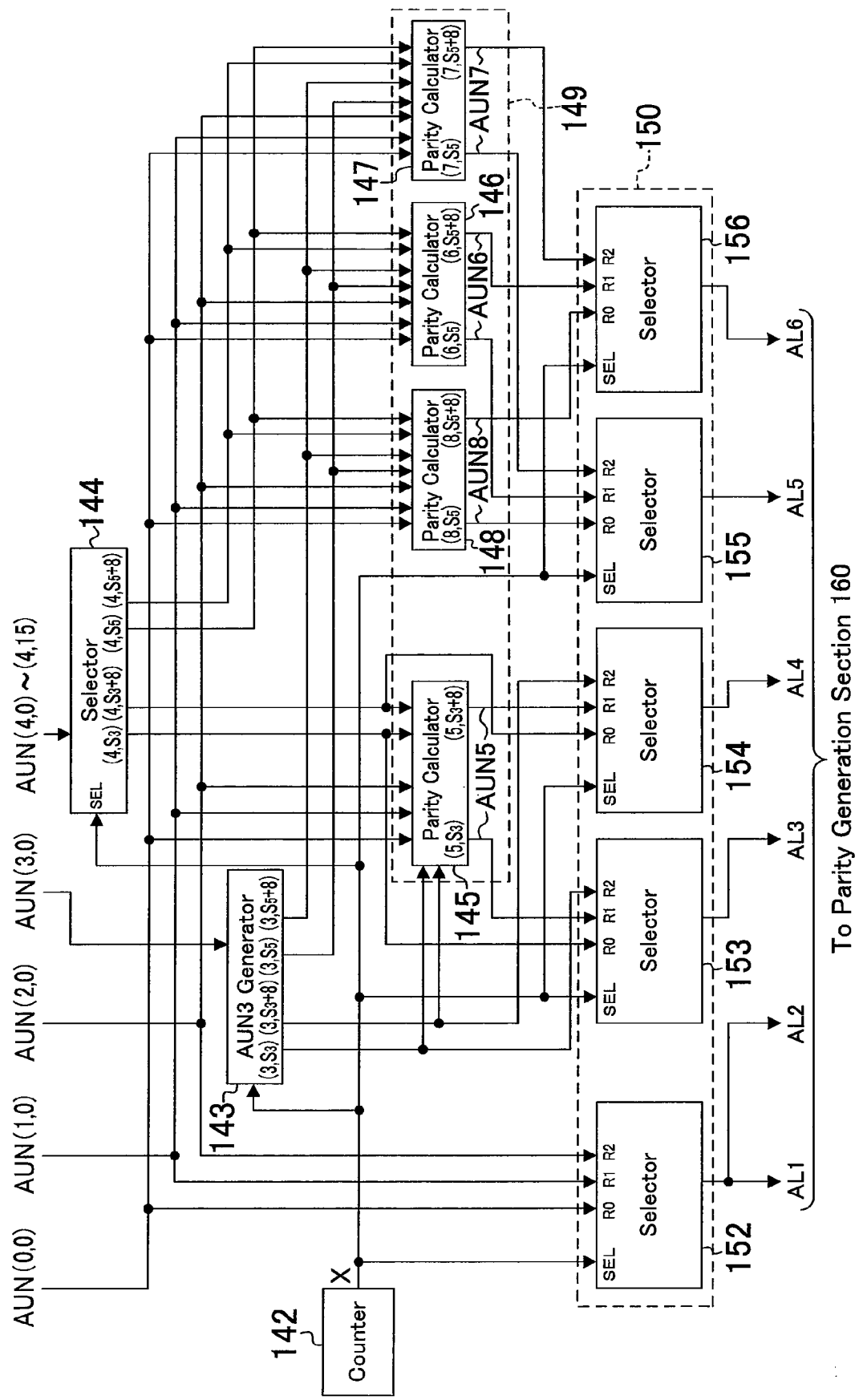
FIG. 9 is a block diagram illustrating an example configuration of the AUN-data generation section of FIG. 1.

FIG. 9 is a block diagram illustrating an example configuration of the AUN-data generation section 140 of FIG. 1. The AUN-data generation section 140 includes a counter 142, an AUN3 generator 143, which serves as an address generator, selectors 144, 152, 153, 154, 155, and 156, and parity calculators 145, 146, 147, and 148. The parity calculators 145 to 148 constitute a parity calculation section 149, and the selectors 152 to 156 constitute a selection section 150. AUN(5, S), AUN(6, S), AUN(7, S), and AUN(8, S) are denoted as AUN5, AUN6, AUN7, and AUN8, respectively. Note that an expression (a, S) in FIG. 9 denotes AUN(a, S) (where "a" is an integer satisfying $3 \leq a \leq 8$. S=$S_3$, $S_3$+8, $S_5$, or $S_5$+8).

The counter 142 counts up by one and outputs a count value X. The count value X represents the column number of FIG. 5. Here, it is assumed that the counter 142 repeats to count up from 0 to 23 in order.

The AUN3 generator 143 generates an address required to generate a column of an address unit number AUN(x, y) after being interleaved in the block of FIG. 5. First, the AUN3 generator 143 calculates a quotient Q, which is obtained from the division operation below using the count value X as follows:

$$Q=(23-X)/3 \quad \text{(Eq. 8)}$$

where Q is the integer part of the quotient. The AUN3 generator 143 further performs the following operation:

$$S_3=(Q+2) \bmod 8 \quad \text{(Eq. 9)}$$

The AUN3 generator 143 replaces the value of the field FL2 of AUN(3, 0) (see FIG. 7) with $S_3$, and outputs the resultant AUN(3, $S_3$) to the selector 153; and replaces the value of the field FL2 of AUN(3, 0) with $S_3$+8, and outputs the resultant AUN(3, $S_3$+8) to the selector 154. The AUN3 generator 143 may obtain AUN(3, $S_3$+8) by replacing the most significant bit of the field FL2 of AUN(3, $S_3$) with "1."

The AUN3 generator 143 also performs the following operation:

$$S_5=(Q+3) \bmod 8 \quad \text{(Eq. 10)}$$

The AUN3 generator 143 replaces the value of the field FL2 of AUN(3, 0) with $S_5$, and outputs the resultant AUN(3, $S_5$) to the parity calculators 146 to 148; and replaces the value of the field FL2 of AUN(3, 0) with $S_5$+8, and outputs the resultant AUN(3, $S_5$+8) to the parity calculators 146 to 148. The AUN3 generator 143 may obtain AUN(3, $S_5$+8) by replacing the most significant bit of the field FL2 of AUN(3, $S_5$) with "1."

The selector 144 calculates $S_3$ and $S_5$ based on the count value X in a similar way to the AUN3 generator 143. The selector 144 selects AUN(4, $S_3$) and outputs it to the selector 153 and the parity calculator 145; and selects AUN(4, $S_3$+8) and outputs it to the selector 154 and the parity calculator 145. The selector 144 also selects AUN(4, $S_5$) and AUN(4, $S_5$+8) and outputs the both to the parity calculators 146 to 148.

The parity calculation section 149 generates AUN parity symbols required to generate a column of an address unit number AUN(x, y) after being interleaved in the block of FIG. 5 based on the resultant address bytes AUN(3, $S_3$), AUN(3, $S_3$+8), AUN(3, $S_5$), and AUN(3, $S_5$+8), as well as the flag bytes AUN(4, $S_3$), AUN(4, $S_3$+8), AUN(4, $S_5$), and AUN(4, $S_5$+8). The parity calculators 145 to 148 are each constituted by, for example, a combinational circuit.

The parity calculator 145 performs an operation of N1 of FIG. 8 using AUN(0, 0), AUN(1, 0) and AUN(2, 0). The parity calculator 145 performs an operation of N2 of FIG. 8 using AUN(3, $S_3$) and AUN(4, $S_3$), then adds the operation result for N2 to the operation result for N1. This generates AUN(5, $S_3$). Also, the parity calculator 145 performs another operation of N2 of FIG. 8 using AUN(3, $S_3$+8) and AUN(4, $S_3$+8), then adds the new operation result for N2 to the operation result for N1. This generates AUN(5, $S_3$+8). AUN(5, $S_3$) and AUN(5, $S_3$+8) are AUN parity symbols. The parity calculator 145 outputs AUN(5, $S_3$) to the selector 153, and AUN(5, $S_3$+8) to the selector 154.

The parity calculator 146 performs an operation of N3 of FIG. 8 using AUN(0, 0), AUN(1, 0) and AUN(2, 0). The parity calculator 146 performs an operation of N4 of FIG. 8 using AUN(3, $S_5$) and AUN(4, $S_5$), then adds the operation result for N4 to the operation result for N3. This generates AUN(6, $S_5$). Also, the parity calculator 146 performs another operation of N4 of FIG. 8 using AUN(3, $S_5$+8) and AUN(4, $S_5$+8), then adds the new operation result for N4 to the operation result for N3. This generates AUN(6, $S_5$+8). AUN(6, $S_5$) and AUN(6, $S_5$+8) are AUN parity symbols. The parity calculator 146 outputs AUN(6, $S_5$) to the selector 155, and AUN(6, $S_5$+8) to the selector 156.

The parity calculator 147 performs an operation of N5 of FIG. 8 using AUN(0, 0), AUN(1, 0) and AUN(2, 0). The parity calculator 147 performs an operation of N6 of FIG. 8 using AUN(3, $S_5$) and AUN(4, $S_5$), then adds the operation result for N6 to the operation result for N5. This generates AUN(7, $S_5$). Also, the parity calculator 147 performs another operation of N6 of FIG. 8 using AUN(3, $S_5$+8) and AUN(4, $S_5$+8), then adds the new operation result for N6 to the operation result for N5. This generates AUN(7, $S_5$+8). AUN(7, $S_5$) and AUN(7, $S_5$+8) are AUN parity symbols. The parity calculator 147 outputs AUN(7, $S_5$) to the selector 155, and AUN(7, $S_5$+8) to the selector 156.

The parity calculator 148 performs an operation of N7 of FIG. 8 using AUN(0, 0), AUN(1, 0) and AUN(2, 0). The parity calculator 148 performs an operation of N8 of FIG. 8 using AUN(3, $S_5$) and AUN(4, $S_5$), then adds the operation result for N8 to the operation result for N7. This generates AUN(8, $S_5$). Also, the parity calculator 148 performs another operation of N8 of FIG. 8 using AUN(3, $S_5$+8) and AUN(4, $S_5$+8), then adds the new operation result for N8 to the operation result for N7. This generates AUN(8, $S_5$+8). AUN(8, $S_5$) and AUN(8, $S_5$+8) are AUN parity symbols. The parity calculator 148 outputs AUN(8, $S_5$) to the selector 155, and AUN(8, $S_5$+8) to the selector 156.

The selection section 150 selects necessary portions from the addresses generated in the AUN3 generator 143 and from the AUN parity symbols generated in the parity calculation section 149, and outputs them as a column of data units included in the block of FIG. 5 to the parity generation section 160.

The selector 152 divides the count value X by 3; selects AUN(0, 0) when the remainder is zero, AUN(1, 0) when the remainder is one, and AUN(2, 0) when the remainder is two; and outputs the selected value to the parity generation section 160 as data AL1 and AL2. The selector 153 divides the count value X by 3; selects AUN(4, $S_3$) when the remainder is zero, AUN(5, $S_3$) when the remainder is one, and AUN(3, $S_3$) when the remainder is two; and outputs the selected value to the parity generation section 160 as data AL3. The selector 154 divides the count value X by 3; selects AUN(4, $S_3$+8) when the remainder is zero, AUN(5, $S_3$+8) when the remainder is one, and AUN(3, $S_3$+8) when the remainder is two; and outputs the selected value to the parity generation section 160 as data AL4.

The selector 155 divides the count value X by 3; selects AUN(8, $S_5$) when the remainder is zero, AUN(6, $S_5$) when the remainder is one, and AUN(7, $S_5$) when the remainder is two; and outputs the selected value to the parity generation section 160 as data AL5. The selector 156 divides the count value X by 3; selects AUN(8, $S_5$+8) when the remainder is zero, AUN(6, $S_5$+8) when the remainder is one, and AUN(7, $S_5$+8) when the remainder is two; and outputs the selected value to the parity generation section 160 as data AL6. The storage section 120 stores the data ALs (AL1 to AL6) in the AUN-data holding area.

The data AL1 to AL6 is the first to sixth rows data of FIG. 5, respectively. Using the AUN-data generation section 140 of FIG. 9, when the count value X is, for example, zero, AUN(0, 0), AUN(0, 8), AUN(4, 1), AUN(4, 9), AUN(8, 2), and AUN(8, 10) of the first column of FIG. 5 can be obtained as the data AL1 to AL6, and when the count value X is one, AUN(1, 0), AUN(1, 8), AUN(5, 1), AUN(5, 9), AUN(6, 2), and AUN(6, 10) of the second column of FIG. 5 can be obtained as the data AL1 to AL6. That is, there is no need to prepare all the data from the first to fifth rows of FIG. 4. Instead, only the top address AUN(0, 0), AUN(1, 0), AUN(2, 0), and AUN(3, 0), and the flag bytes AUN(4, 0), AUN(4, 1), . . . , and AUN(4, 15) of FIG. 4 are sufficient in order to generate the AUNs of the first to sixth rows of FIG. 5 sequentially on a column-by-column basis.

Figure 10:
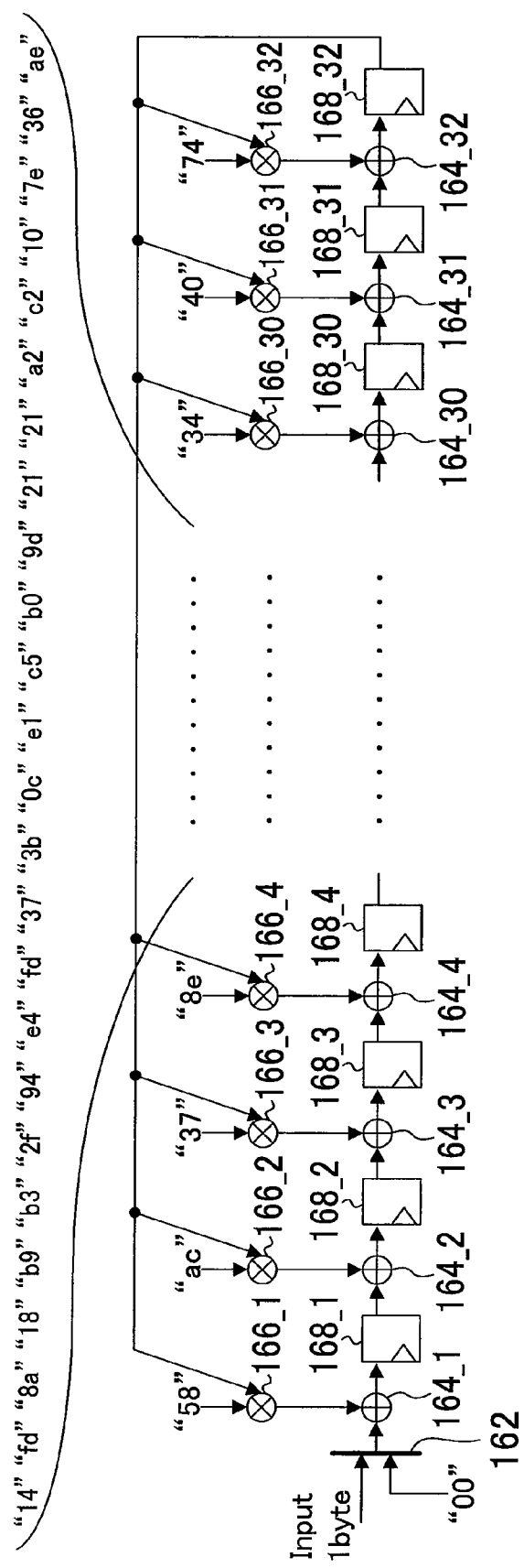
FIG. 10 is a block diagram illustrating an example configuration of the remainder calculator included in the parity generation section of FIG. 1.

The parity generation section 160 includes a remainder calculator which divides the data of each column of FIG. 5 using a predetermined polynomial, and calculates a remainder. FIG. 10 is a block diagram illustrating an example configuration of the remainder calculator included in the parity generation section 160 of FIG. 1. This remainder calculator includes a selector 162, adders 164_1 to 164_32, multipliers 166_1 to 166_32, and registers 168_1 to 168_32. The registers 168_1 to 168_32 output the stored values in synchronization with a clock.

The selector 162 outputs to the adder 164_1 on a byte-by-byte basis the first column data of FIG. 5, that is, the six bytes of data AL1 to AL6 received from the AUN-data generation section 140 and the 24 bytes of user control data UCD(0, 0), UCD(1, 0), . . . , UCD(17, 0), UCD(0, 1), UCD(1, 1), . . . , and UCD(5, 1). The multiplier 166_1 multiplies an output of the register 168_32 by a value "58," and outputs the resultant product to the adder 164_1. The adder 164_1 adds the output of the selector 162 to the output of the multiplier 166_1, and outputs the resultant sum to the register 168_1. The register 168_1 stores this sum, and outputs the sum to the adder 164_2 in synchronization with the clock. The adders 164_2 to 164_32, the multipliers 166_2 to 166_32, and the registers 168_2 to 168_32 operate in a similar fashion.

After 30 clock pulses were input and the 30 bytes of the first column of FIG. 5 were output, then the selector 162 selects and outputs a value "00." After 32 clock pulses were input, BIS parity symbols BP(0, 0), BP(1, 0), . . . , and BP(31, 0) of FIG. 6 are obtained as the output values of the registers 168_1 to 168_32. The storage section 120 stores the parity symbols BP(0, 0) to BP(31, 0) in the BIS-parity-symbol holding area.

In a similar fashion, the parity generation section 160 generates the 32 bytes of BIS parity symbols BPs of FIG. 6 for the rest of the columns of FIG. 5 on a column-by-column basis, based on six bytes of AUNs and 24 bytes of UCDs, and then stores the BPs in the storage section 120. Due to these operations, there is no need to prepare all the data from the first to fifth rows of FIG. 4. Instead, the parity generation section 160 can generate the BIS parity symbols BPs of FIG. 6 sequentially on a column-by-column basis.

A case where the AUN-data generation section 140 outputs the six bytes of data AL1 to AL6 to the parity generation section 160 in parallel has been described. However, data having a different width than six bytes may be output to the parity generation section 160.

It is assumed that the user-data holding area of the storage section 120 stores user data which is neither scrambled nor has any EDC added. EDC generation, scrambling, and LDC parity generation for user data are all performed on a same column of user data. Therefore, EDC generation, scrambling, and LDC parity generation can be performed by reading user data from the storage section 120 sequentially on a column-by-column basis.

The EDC generator 134 generates an error detection code (EDC) from a stream of user data, and outputs the EDC to the data scrambler 136. The data scrambler 136 scrambles the stream of user data and replaces a part thereof with the EDC, then outputs the result to the parity generation section 160. As seed data for data scramble, an address stored in the information holding section 132 can be used. The EDC generator 134 may overwrite a part of the user data stored in the storage section 120 with the generated EDC.

The parity generation section 160 generates LDC parity symbols from data which is output from the data scrambler 136, and outputs the LDC parity symbols to the storage section 120. The storage section 120 stores the LDC parity symbols in the LDC-parity-symbol holding area. Since LDC parity symbols for user data are also Reed-Solomon codes as with BIS parity symbols, and have 32 bytes, the remainder calculator of FIG. 10 can also generate LDC parity symbols.

User data stored in the storage section 120 may be scrambled or may have an EDC added. Even in such cases, using an address stored in the information holding section 132, and/or using the remainder calculator of FIG. 10 for generating both BIS and LDC parity symbols are possible.

Now that an overview of one embodiment of the present invention has been disclosed, a number of features and advantages of the present invention are apparent. Therefore, it is intended that such features and advantages of the present invention be entirely covered by the appended claims. In addition, since those skilled in the art can easily implement various changes and modifications, the present invention should not be interpreted to limit the disclosure to the completely same configurations and operations as drawn and described herein. Therefore, any suitable variations and equivalents are deemed to fall within the scope and spirit of the present invention.

As described above, since the embodiment of the present invention allows for acceleration of parity generation, the present invention is useful for encoders and optical disk recording devices, etc.

What is claimed is:

1. An encoder which generates a block including a plurality of addresses, a plurality of flag bytes respectively corresponding to the plurality of addresses, and a plurality of sets of first parity symbols respectively corresponding to the plurality of addresses, where the plurality of addresses, the plurality of flag bytes, and the plurality of sets of first parity symbols are interleaved according to a predetermined rule, and which generates a plurality of sets of second parity symbols respectively corresponding to each column of data units included in the block, comprising:

an information holding section configured to store the plurality of flag bytes and an initial address;

a data generation section configured to generate the plurality of sets of first parity symbols from the initial address and from the plurality of flag bytes; and a parity generation section configured to generate and output the plurality of sets of second parity symbols, for each column of data units included in the block, from the columns of data units included in the block and from input user control data, wherein the data generation section generates the addresses and the sets of first parity symbols, required to generate the columns of data units included in the block, based on the initial address and the plurality of flag bytes, selects necessary portions from the plurality of flag bytes and the addresses and the sets of first parity symbols generated, and outputs the portions to the parity generation section, as the columns of data units included in the block.

2. An encoder of claim 1, wherein
the information holding section stores one of the plurality of addresses as the initial address.

3. An encoder of claim 2, wherein
the initial address is a top address of the plurality of addresses.

4. An encoder of claim 1, wherein
the plurality of addresses are allocated with equal intervals.

5. An encoder of claim 4, wherein
the plurality of addresses each has a value of zero in the least significant bit, and a same value in a predetermined number of most significant bits.

6. An encoder of claim 1, wherein
the data generation section includes
a counter,
an address generator configured to generate the addresses according to a count value of the counter,
a parity calculation section configured to generate the sets of first parity symbols based on the addresses generated by the address generator and on the flag bytes, and
a selection section configured to select and output necessary portions from the plurality of flag bytes and the addresses and the sets of first parity symbols generated.

7. An encoder of claim 6, wherein
the parity calculation section is constituted by a combinational circuit.

8. An encoder of claim 1, wherein
the parity generation section includes a remainder calculator which divides the addresses and the sets of first parity symbols calculated in the data generation section by a predetermined polynomial to obtain a remainder.

9. An encoder of claim 1, further comprising:
a storage section configured to store the sets of first parity symbols.

10. An encoder of claim 1, further comprising:
a storage section configured to store the user control data, wherein
the parity generation section generates the sets of second parity symbols using the user control data read from the storage section.

11. An encoder of claim 1, further comprising:
a storage section configured to store the input user data, wherein
the parity generation section generates LDC (Long Distance Code) parity symbols using the user data read from the storage section, and writes the LDC parity symbols to the storage section.

12. An encoder of claim 11, further comprising:
a scrambler configured to scramble the user data read from the storage section according to the initial address output from the information holding section, wherein
the parity generation section generates the LDC parity symbols using the user data scrambled by the scrambler.

13. An encoder of claim 12, wherein
the user data stored in the storage section has one or more error detection codes added.

14. An encoder of claim 12, further comprising:
an error-detection-code generator configured to calculate an error detection code based on the user data read from the storage section, wherein
the scrambler replaces a part of the user data with the error detection code.

15. An encoder of claim 14, wherein
the error-detection-code generator overwrites a part of the user data stored in the storage section with the calculated error detection code.

16. An encoder of claim 11, wherein
the storage section is an SDRAM (Synchronous Dynamic Random-Access Memory).

17. An encoder of claim 1, wherein
the sets of first parity symbols are Reed-Solomon codes.

18. An encoder of claim 1, wherein
the predetermined rule complies with the Blu-ray Disc specification.

19. An optical disk recording apparatus which records user control data and user data onto an optical disk, comprising:
an encoder configured to generate a block including a plurality of addresses, a plurality of flag bytes respectively corresponding to the plurality of addresses, and a plurality of sets of first parity symbols respectively corresponding to the plurality of addresses, where the plurality of addresses, the plurality of flag bytes, and the plurality of sets of first parity symbols are interleaved according to a predetermined rule, and to generate a plurality of sets of second parity symbols respectively corresponding to each column of data units included in the block;
an interleaver configured to interleave the block, the plurality of sets of second parity symbols, the user control data, the user data, and LDC parity symbols calculated based on the user data;
a modulator configured to generate a modulated signal depending on the interleaved data; and
an optical pickup configured to record the modulated signal onto the optical disk, wherein
the encoder includes
an information holding section configured to store the plurality of flag bytes and an initial address;
a data generation section configured to generate the plurality of sets of first parity symbols from the initial address and from the plurality of flag bytes; and
a parity generation section configured to generate and output the plurality of sets of second parity symbols, for each column of data units included in the block, from the columns of data units included in the block and from the user control data, and wherein
the data generation section generates the addresses and the sets of first parity symbols, required to generate the columns of data units included in the block, based on the initial address and the plurality of flag bytes, selects necessary portions from the plurality of flag bytes and the addresses and the sets of first parity symbols generated, and outputs the portions to the parity generation section, as the columns of data units included in the block.

* * * * *